DUAL-BAND TRANSMISSION LINE TUNABLE RESONANT TANK CIRCUIT

Filed Oct. 24, 1966

INVENTORS
VINCENT R. DeLONG
WILLIAM J. DURSPEK JR.
MARVIN D. WELTHA
BY
Woody and Kintzinger
ATTORNEYS

DUAL-BAND TRANSMISSION LINE TUNABLE RESONANT TANK CIRCUIT

Filed Oct. 24, 1966

INVENTORS
VINCENT R. DeLONG
WILLIAM J. DURSPEK JR
MARVIN D. WELTHA
BY
Moody and Kintzinger
ATTORNEYS United States Patent Office 3,452,293

Patented June 24, 1969

3,452,293

DUAL-BAND TRANSMISSION LINE TUNABLE RESONANT TANK CIRCUIT

Vincent R. De Long, William J. Durspek, Jr., and Marvin D. Weltha, Marion, Iowa, assignors to Collins Radio Company, Cedar Rapids, Iowa, a corporation of Iowa Filed Oct. 24, 1966, Ser. No. 588,897
Int. Cl. H01p 7/04
U.S. Cl. 330—56 10 Claims This invention relates in general to radio frequency tuners, and in particular, to a dual-band transmission line tunable resonant tank circuit suitable for use with a transmitter power output coupling circuit through, for example, both the VHF and UHF frequency bands of 118 to 136 mc. and 225 to 400 mc., respectively, and including a switch device for switching between the VHF and UHF modes of operation.

Figure 1:
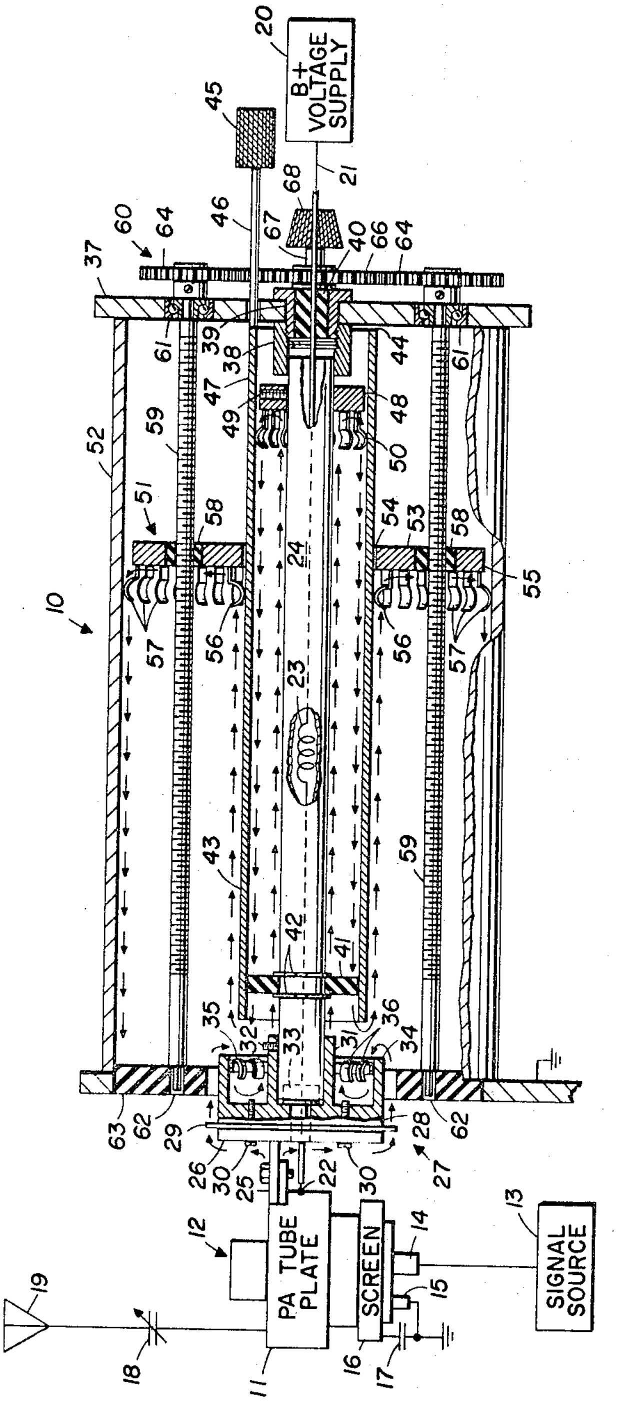

Most existing transmitter-to-antenna transmission line radio frequency tuners are particularly designed for and operational through only one frequency band of operation or, if designed for operation extending through the VHF and UHF radio frequency bands, problems of efficiency, size, weight, and complexity are presented. Further, some of the tuners are continuously tunable through undesired intervening frequencies between two desired frequency bands of operation.

It is, therefore, a principal object of this invention to provide a high Q transmission line resonator in the form of a tunable resonant tank circuit, of the foreshortened quarter-wave type, with power amplifier output tuning through dual bands, and with switching capabilities from band to band between the bands.

Another object is to provide such a tunable resonant tank circuit with tuning through both the desired VHF and UHF bands of operation being accomplished by a shorting slider through a range of tuning adjustment movement which is substantially the same for both of the operational frequency bandwidths desired.

A further object is to provide such a tunable resonant tank circuit with, in effect, two concentric transmission lines with reactances adding in series when in VHF band mode of operation, and with the innermost concentric transmission line shorted out for the UHF bandwidth mode of operation and only the outer transmission line operative for that mode of operation.

Still another object is to provide such a highly efficient tunable resonant tank circuit particularly useful for a single transmitter with the capability of functioning on both the VHF and UHF frequency bands, with possibilities of any significant parallel path loading substantially eliminated.

Features of this invention useful in accomplishing the above objects include, in a dual-band tunable resonant tank circuit for a transmitter power amplifier output to antenna transmission line, a high Q transmission line like resonator circuit structure of the foreshortened quarter-wave type, in effect, folded back on itself, with manually controlled switching capabilities from band to band between the bands. It is a resonant tank circuit in effect, two mutually concentric transmission lines with reactances adding in series when in the VHF band mode of operation, and, with the UHF mode of operation, the innermost concentric transmission line shorted out and only the outermost concentric transmission line portion of the tank circuit operative for that mode of operation. It is a tunable resonant tank circuit utilizing a single shorting tuning slider for tuning through both the desired VHF and the UHF bands of operation with the range of tuning adjustment movement for both bands of operation being substantially the same.

A specific embodiment representing what is presently regarded as the best mode of carrying out the invention is illustrated in the accompanying drawings.

Figures 2, 3:
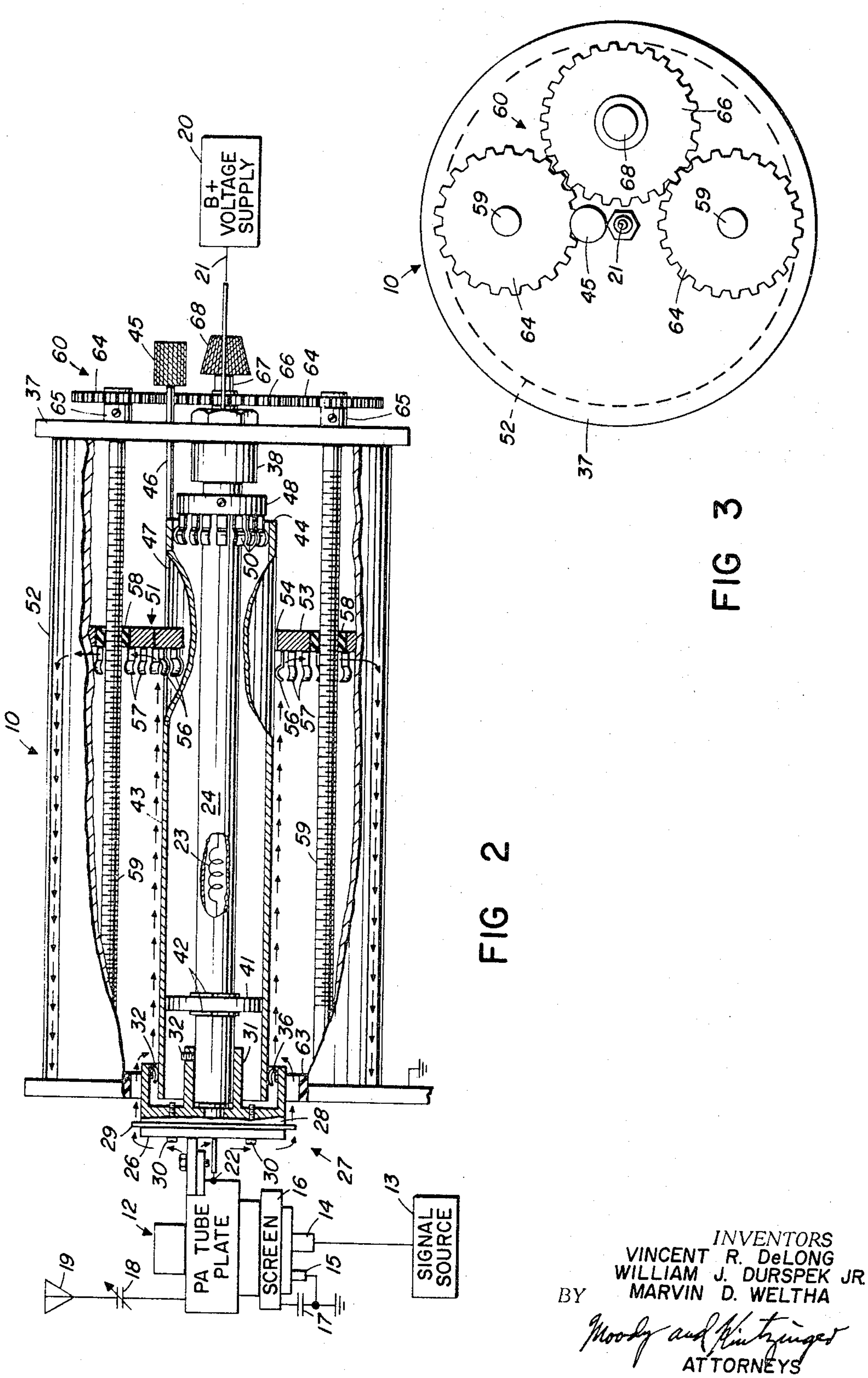

In the drawings:

FIGURE 1 represents applicants' dual-band tunable resonant tank circuit structure partially broken away and sectioned for greater interior detail, with the tank circuit set for the VHF mode of operation, and with interconnecting circuitry indicated in block schematic form:

FIGURE 2, a view of the tank circuit and the tank circuit structure and the associated circuitry similar to FIGURE 1, with, however, the tank circuit set for the UHF mode of operation; and, FIGURE 3, an end view of the resonant tank circuit structure showing the setting knobs and a tuning adjustment gear drive train thereof.

Referring to the drawings:

The dual-band tunable resonant tank circuit structure 10 of FIGURES 1 and 2 is shown to be electrically RF signal coupled to the plate 11 of a final power amplifier tube 12 of a transmitter, not detailed. An RF signal source 13 of the transmttter is connected to the control grid 14 of final power amplifier tube 12, the cathode 15 of which is connected to ground, and with a screen grid 16 connection through capacitor 17 to ground. The plate 11 output connection of final power amplifier tube 12 is through air variable capacitor 18 to antenna 19. It is interesting to note that the connection to the power amplifier plate 11 connection to B+ voltage supply 20 is through an insulated line 21 extended from plate connection 22, generally, concentrically through the center of the dual-band tunable resonant tank circuit structure 10. Further, line 21 includes at least one RF choke coil 23 that is either insulated or supported in insulating spaced relation within and from the tube 24 of structure 10 in a conventional manner, detail not shown.

The RF signal coupling from the outer circumferential portion of plate 11 of the power amplifier tube 12 to the resonant tank circuit structure 10 is through the flange extension 25 of RF signal coupling capacitor plate 26 with the extension 25 abutting a portion of the power amplifier plate structure 11 and connected thereto in a conventional manner. Plate 26 forms an RF signal coupling capacitor 27 with capacitor plate structure 28 through a relatively thin intervening disc of dielectric material 29 with the capacitor held in fixed assembled relation as by plastic dielectric material screws. Capacitor plate structure 28 is equipped with a hub-like longitudinal extension 31 which fits, and is locked in place by set screw 32, on the inner center conductor tube 24 through which line 22 extends. The capacitive plate structure 28 is also equipped with a plug insert 33 having a shank extending through the capacitor 27 structure and an enlarged head fitting within the inside diameter of tube 24 and an opening through the center thereof through which line 21 passes for centering of the line 21 at that end of tube 24. The capacitor plate structure 28 is also equipped with a longitudinally extended annular ring extension 34 to the inside of which an annular ring 35 of ring contact fingers 36 is fastened as by silver solder or brazing.

The inner center conductor tube 24 extends from the end locked-in position in extension 31, of capacitor plate structure 28, longitudinally through its length to a fastening with end mounting plate 37, so as to provide for a foreshortened quarter-wave tunable resonant tank circuit 10 operational through the dual frequency bands desired. Tube 24 is provided with a threaded sleeve 38, fixed as by set screw, brazing or solder on the end of tube 24, into which a large-headed plug 39 is threaded in order to lock the tube 24 to the plate 37. Plug 39 is equipped with a center tubular sleeve 40 of insulating material through which line 21 is passed for centering of the line 21 at that end of tube 24 (actually plug 39 may be in the form of an RF filter capacitor to ground). An annular washerlike member 41 of nonconductive material having good bearing properties, such as nylon, is longitudinally fixed on tubular member 24 as by lock rings 42, for providing concentric relation maintaining bearing support for a longitudinally movable electrically conductive material tube 43. Tubular sleeve 43 is longitudinally movable from the position shown in FIGURE 1 with end 44 in abutment, or substantially so, with end mounting plate 37 to a position, as shown in FIGURE 2, with the other end in inserted engagement with the resilient conductive fingers 36 mounted in capacitor plate structure 28. This movement of sleeve 43 is controlled by manually moved knob 45 in longitudinal back and forth range switching movement thereof as exerted through the rod 46 extended through a clearance opening 47 in the mounting plate 37 and connected to the sleeve.

Another important feature is a shorting plug 48 mounted on the inner tube 24 as by set screw 49 in a predetermined adjusted frequency setting position, and equipped with an annular ring of resilient contact fingers 50. This provides a shorting RF signal circuit path from the tube 24 through the base member 48 and the fingers 50 to the inside of sleeve 43, but only when sleeve 43 is in the position as shown in FIGURE 1 and not in the shorted out position of FIGURE 2. This is so since the tubular sleeve 43 is directly shorted from internal RF signal flow for the UHF mode of operation as shown in FIGURE 2, as opposed to the VHF mode of operation of FIGURE 1 when the sleeve is not in the shorted position and the interior of the sleeve along with the outer surface of the innermost center tubular conductor 24 act as a transmission line extension, in the tunable resonant tank circuit, in addition to the outer transmission portion of the tunable resonant tank circuit immediately hereinafter described.

The outer portion of the dual-band tunable resonant tank circuit structure 10 is that part of the effective RF transmission line length of the resonant tank circuit in a sense folded back on itself with respect to the VHF mode of operation as shown in FIGURE 1, and the only section utilized in the UHF mode of operation. This outer transmission line like portion includes the outer surface of tubular sleeve 43 from its connection with annular ring extension 34 of capacitor plate structure 28, through the contact fingers 36 and annular ring 35, to an adjustably tuning positionable shorting slider structure 51, and through the structure 51 to the interior surface of outermost tubular sleeve 52 then extends back on the interior surface of the tubular sleeve 52 to the grounded power amplifier tube 12 end of the resonant tank circuit structure 10.

The shorting slider structure 51 is equipped with an electrically conductive annular disc 53 having a center opening 54 with sufficient clearance from the tubular sleeve 43 for free longitudinal faequency tuning adjusting movement backwards and forwards therealong, and an outer circumferential edge 55 having an adequate degree of clearance, for operational purposes, from the interior surface of tubular sleeve 52. The annular disc 53 of the tuning positionable shorting slider structure 51 mounts an inner annular ring of resilient contact fingers 56 that are inwardly oriented for resilient slidable bearing contact on the outer surface of tubular sleeve 43. The annular disc 53 also mounts an outer annular ring of resilient contact fingers 57 that are outwardly oriented for resilient slidable bearing contact with the inner surface of tubular sleeve 52 continuously as the shorting slider structure 51 is moved longitudinally back and forth in tuning adjustment for both frequency bands of operation. The annular ring 53 of the adjustable tuning shorting slider structure 51 is also equipped with two internally threaded plastic inserts 58 of nylon, advantageously having a low friction coefficient, as a tuning drive positioning connection for the shorting slider structure 51 with two driving lead screws 59 extended longitudinally through the resonant tank circuit structure 10. The driving lead screws 59 extend from a gear train drive 60 provided therefor at the outer side of mounting plate 37 through support bearings 61 to bearing support in openings 62 of the low loss, glass-Teflon structural member 63 provided at the power tube 12 end of the resonant tank circuit structure 10.

Referring also to FIGURE 3, each driving lead screw 59 has a gear 64 fixed thereon as by a set screw 65 at the gear train drive 60 end thereof as a part of the drive 60 with each of the gears 64 meshing in common with a gear 66 rotatably mounted, as by shaft 67 and conventional bearing means, in mounting plate 37. The shaft 67, rotatably mounting gear 66 on mounting plate 37, is also equipped with a knob 68 for manually controlled rotation of gear 66 and thereby adjustive tuning positioning of the shorting slider structure 51 back and forth between tuning adjustment limit positions for both the VHF mode of operation and the UHF mode of operation.

Thus, it may be seen that this invention provides a very effective and highly efficient two-band transmission line resonator circuit structure as a high Q transmission line resonator tunable resonant tank circuit, of the foreshortened quarter-wave type with power amplifier output tuning through dual bands, and with switching capabilities from band to band between the bands. It is a tunable resonant tank circuit with, in effect, two concentric transmission lines with reactances adding in series when in the VHF band mode of operation, in effect folded back on itself, and with the innermost concentric transmission line shorted out for the UHF band-width mode of operation, and only the outer concentric transmission line portion of the tank circuit operative for that mode of operation. It is a tunable resonant tank circuit utilizing the same tuning adjustably positioned shorting slider for tuning through both the desired VHF and UHF bands of operation through a predetermined range of tuning adjustment movement substantially the same for both of the operational frequency bandwidths. While the RF current flow is substantially uniformly distributed about the respective conductive surfaces involved, it follows paths as indicated by the arrows in the plane of the views for the respective modes of operation.

Whereas this invention is here illustrated and described with respect to a specific embodiment thereof, it should be realized that various changes may be made without departing from essential contributions to the art made by the teachings hereof.

We claim:

1. In a tunable dual-band RF resonant tank circuit, RF signal input means at one end of the tunable resonant tank circuit; an inner conductor connected to said signal input means and longitudinally extended to predetermined length; an annular sleeve of conductive material supported in mutually spaced surrounding relation to said inner conductor throughout most of the operational length of said inner conductor; RF signal conductive means mounted on said innermost conductor providing an annular RF signal path interconnecting said inner conductor and said annular sleeve; a longitudinally extended outermost conductor in mutually annularly spaced relation to said sleeve throughout the operational length of said sleeve; RF signal tuning means providing an RF signal path interconnecting said sleeve and said outer conductor, and mounted for tuning movement back and forth longitudinally along said conductive annular sleeve and said outermost conductor; tuning drive means for tuning position shifting of said tuning means; and means for selectively shorting RF directly to said sleeve conductor for switching from one frequency band mode to the other frequency band mode of operation.

2. The tunable dual-band RF resonant tank circuit of claim 1, wherein said annular sleeve is mounted for longitudinal shifting movement back and forth from a position wherein RF signaling flows to said inner conductor to a longitudinal position in direct RF signal shorted path relation to said input means with said inner conductor shorted from the input RF signal; and means for shifting said sleeve longitudinally from one frequency band mode to the other frequency band mode of operation.

3. The tunable dual-band RF resonant tank circuit of claim 2, wherein the length of the inner conductor, the annular sleeve, and the outermost conductor are of such predetermined lengths as to provide a tunable resonant tank circuit of the foreshortened quarter-wave type.

4. The tunable dual-band RF resonant tank circuit of claim 3 wherein the tunable resonant tank circuit is, in effect, two concentric transmission lines with reactances adding in series in the VHF band mode of operation and with the innermost concentric transmission line portion shorted out for the UHF band mode of operation with only the outer transmission line section operative for that mode of operation.

5. The tunable dual-band RF resonant circuit of claim 2, wherein said inner conductor, said annular sleeve, and said outer conductor are substantially concentric one to another; said RF signal input means at one end of the tunable resonant tank circuit being equipped with an annular ring of resiliently biased conductive fingers positioned for RF signal direct shorting contact with said annular sleeve when said annular sleeve is shifted into RF signal shorted path relation to said input means.

6. The tunable dual-band RF resonant tank circuit of claim 5, wherein said RF signal tuning means is a conductive annular member supported between said sleeve and said outer conductor for longitudinal movement therealong and includes, an inward annular ring of resiliently biased electrically conductive contact fingers for providing resiliently biased electrical contact with the outer surface of said sleeve throughout longitudinal tuning movement of said tuning means, and an outer annular ring of outwardly resiliently biased contact fingers for resilient biased contact with the inner surface of said outer conductor throughout tuning adjustment movement of said tuning means; said tuning means also being equipped with threaded drive means in said conductive annular member; and means mounted at an end of said tank circuit with lead screw means extending to and through said threaded drive means for tuning drive control of said tuning means.

7. The tunable dual-band RF resonant tank circuit of claim 6, wherein said inner conductor is a tubular conductor connected to said RF signal input means; said RF signal input means being connected to the plate of a power amplifier tube; a B+ voltage supply for the plate of said power amplifier tube; and conductive line means from the B+ voltage suupply to said power amplifier tube plate extending from the B+ voltage supply through said tubular inner conductor.

8. The tunable dual-band RF resonant tank circuit of claim 7, wherein RF choke coil means is provided in said B+ voltage line within the tubular inner conductor.

9. The tunable dual-band RF resonant tank circuit of claim 7, wherein said signal input means includes a signal coupling capacitor in a signal connection between said power amplifier tube plate and the tank circuit.

10. The tunable dual-band RF resonant tank circuit of claim 9, wherein the capacitor plate structure of the tank circuit side of the signal coupling capacitor includes, means mounting said annular ring of resiliently biased electrcally conductive fingers for establishing direct RF signal transmission to said annular sleeve when it is shifted into engagement therewith for a UHF mode of operation from a VHF mode of operation.

References Cited

UNITED STATES PATENTS

| | | | |
|---|---|---|---|
| 2,181,901 | 12/1939 | Lindenblad | 333—82 |
| 2,531,683 | 11/1950 | Izenour | 333—82 |
| 2,659,025 | 11/1953 | Huggins | 333—82 |
| 2,752,494 | 6/1956 | Finke et al. | 334—41 |
| 2,796,587 | 6/1957 | Phillips | 333—82 |
| 2,804,544 | 8/1957 | Lannan et al. | 334—42 X |
| 3,325,746 | 6/1967 | Clark | 330—56 |

HERMAN K. SAALBACH, *Primary Examiner.*

WM. H. PUNTER, *Assistant Examiner.*

U.S. Cl. X.R.

333—82; 334—3, 42, 47